United States Patent
Jiang et al.

(10) Patent No.: US 7,286,005 B2
(45) Date of Patent: Oct. 23, 2007

(54) SUPPLY VOLTAGE SWITCHING CIRCUIT

(75) Inventors: Wu Jiang, Shenzhen (CN); Yong-Zhao Huang, Shenzhen (CN); Yun Li, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/300,760

(22) Filed: Dec. 15, 2005

(65) Prior Publication Data

US 2006/0132199 A1    Jun. 22, 2006

(30) Foreign Application Priority Data

Dec. 17, 2004    (CN) .................. 2004 1 0077633

(51) Int. Cl.
*H02M 1/10* (2006.01)
(52) U.S. Cl. .................. 327/547; 327/544; 327/530; 327/112; 327/333; 326/62; 326/63; 326/68; 326/80; 307/80; 307/65; 307/85
(58) Field of Classification Search ............... 327/333, 327/108, 112, 547
See application file for complete search history.

(56) References Cited

U.S. PATENT DOCUMENTS

| | | | | |
|---|---|---|---|---|
| 5,517,153 A | | 5/1996 | Yin et al. .................. 327/546 |
| 6,130,549 A | * | 10/2000 | Buck .................. 326/26 |
| 6,201,437 B1 | * | 3/2001 | Kono et al. .................. 327/545 |
| 6,353,353 B1 | * | 3/2002 | Nakayama .................. 327/382 |
| 6,844,769 B2 | * | 1/2005 | Yamamoto et al. .......... 327/333 |
| 6,879,060 B2 | * | 4/2005 | Hohri .................. 307/64 |
| 6,960,843 B2 | * | 11/2005 | Yamamoto .................. 307/86 |
| 7,141,892 B2 | * | 11/2006 | Dai et al. .................. 307/64 |
| 2003/0048116 A1 | * | 3/2003 | Suetsugu .................. 327/112 |
| 2003/0179021 A1 | * | 9/2003 | Braun et al. .................. 327/108 |
| 2003/0231033 A1 | * | 12/2003 | Koch et al. .................. 327/108 |
| 2004/0051389 A1 | * | 3/2004 | Verbist et al. .................. 307/80 |
| 2004/0217653 A1 | * | 11/2004 | Neidorff .................. 307/80 |
| 2006/0132199 A1 | * | 6/2006 | Jiang et al. .................. 327/112 |
| 2006/0214718 A1 | * | 9/2006 | Chen .................. 327/333 |

* cited by examiner

*Primary Examiner*—Tuan T. Lam
*Assistant Examiner*—Hiep Nguyen
(74) *Attorney, Agent, or Firm*—Morris Manning Martin LLP; Tim Tingkang Xia, Esq.

(57) ABSTRACT

A supply voltage switching circuit for a computer includes a chipset, a first transistor, a second transistor, and a third transistor. The chipset includes a first MOSFET and a second MOSFET. A 5V system voltage and a 5V standby voltage are respectively inputted to sources of the first MOSFET and the second MOSFET. Gates of the first MOSFET and the second MOSFET are respectively coupled to collectors of the second transistor and the third transistor. A base of the first transistor is coupled to a terminal for receiving a control signal from the computer. The 5V standby voltage is inputted to a collector of the first transistor. Bases of the second transistor and the third transistor are coupled to the collector of the first transistor. A 12V system voltage and the 5V standby voltage are respectively inputted to collectors of the second transistor and the third transistor.

15 Claims, 2 Drawing Sheets

SUPPLY VOLTAGE SWITCHING CIRCUIT

CROSS-REFERENCE TO RELATED APPLICATION

Related subject matter is disclosed in a U.S. Patent Application entitled "SUPPLY VOLTAGE SWITCHING CIRCUIT", filed on Dec. 15, 2005 with application Ser. No. 11/300,699, and assigned to the same assignee with this application.

BACKGROUND

1. Field of the Invention

The present invention relates to a supply voltage switching circuit for a computer, and more particularly to a supply voltage switching circuit which can prevent the computer from being down when the computer is waken up.

2. General Background

In general, a user can make a computer go to a sleep mode through a user setting in Advanced Configuration and Power Interface (ACPI), in order to protect the computer and save energy. The user can also wake up the sleeping computer by peripheral equipments such as keyboard, mouse, Universal Serial Bus (USB) and etc.

A working voltage is provided by a supply voltage switching circuit. When the computer is at a work mode, the supply voltage switching circuit provides a 5V system voltage (5V_SYS). When the computer is at a sleep mode, the supply voltage switching circuit provides a 5V standby voltage (5V_SB).

Referring to FIG. 3, a typical supply voltage switching circuit for a computer includes a chipset 3', a metal-oxide-semiconductor field-effect transistor (MOSFET) Q1' and a MOSFET Q2'. The MOSFET Q1' and the MOSFET Q2' are N-channel-strengthen MOSFETS. A gate of the MOSFET Q1' is connected to a terminal 2'. A source of the MOSFET Q1' is grounded. A drain of the MOSFET Q1' is coupled to a 5V_SB. A gate of the MOSFET Q2' is connected to the drain of the MOSFET Q1'. A source of the MOSFET Q2' is grounded. A drain of the MOSFET Q2' is coupled to a 12V_SYS. The chipset 3' includes a MOSFET Q3' and a MOSFET Q4'. The MOSFET Q3' is an N-channel-strengthen MOSFET and the MOSFET Q4' is P-channel-strengthen MOSFET. A gate of the MOSFET Q3' is coupled to a 12V_SYS. A source of the MOSFET Q3' is coupled to a 5V_SYS. A drain of the MOSFET Q3' is connected to a terminal 1'. A gate of the MOSFET Q4' is coupled to the 12V_SYS. A source of the MOSFET Q4' is coupled to the 5V_SB. A drain of the MOSFET Q4' is connected to the terminal 1'.

A working process of the typical supply voltage switching circuit includes two stages. At the first stage, the computer is at a sleep mode, and a low level voltage from the computer is inputted to the gate of the MOSFET Q1' via the terminal 2'. The MOSFET Q1' is turned off and the MOSFET Q2' is turned on. So an output voltage of the drain of the MOSFET Q2' is at a low level. Because the MOSFET Q4' is a P-channel-strengthen MOSFET and the MOSFET Q3' is an N-channel-strengthen MOSFET, the MOSFET Q4' is turned on and the MOSFET Q3' is turned off. So the terminal 1' outputs the 5V_SB at the first stage. At the second stage, the computer is at a work mode, and a power-ok (PWR-OK) signal from the computer is inputted to the gate of the MOSFET Q1' via the terminal 2'. The MOSFET Q1' is turned on and an input voltage of the gate of the MOSFET Q2' is at a low level. So the MOSFET Q2' is turned off and the 12V_SYS is outputted to the gates of the MOSFET Q3' and the MOSFET Q4'. The MOSFET Q3' is turned on and the MOSFET Q4' is turned off. So the terminal 1' outputs the 5V_SYS at the second stage. That is, when the PWR-OK signal is inputted to the typical supply voltage switching circuit, the terminal 1' outputs the 5V_SYS.

However, the typical supply voltage switching has a disadvantage. Because the 12V_SYS is inputted to the gates of the MOSFET Q3' and the MOSFET Q4' at the same time, the MOSFET Q4' is turned off quickly before the MOSFET Q3' is turned on. So the output voltage of the terminal 1' has a great voltage drop. When a computer is waken up at a sleep mode, the computer will be down because of the voltage drop.

What is needed is a supply voltage switching circuit for a computer which can prevent the computer from being down when the computer is waken up.

SUMMARY

A supply voltage switching circuit for a computer includes a chipset, a first transistor, a second transistor, and a third transistor. The chipset includes a first MOSFET and a second MOSFET. A 5V system voltage and a 5V standby voltage are respectively inputted to sources of the first MOSFET and the second MOSFET. Gates of the first MOSFET and the second MOSFET are respectively coupled to collectors of the second transistor and the third transistor. A base of the first transistor is coupled to a terminal for receiving a control signal from the computer. The 5V standby voltage is inputted to a collector of the first transistor. Bases of the second transistor and the third transistor are coupled to the collector of the first transistor. A 12V system voltage and the 5V standby voltage are respectively inputted to collectors of the second transistor and the third transistor.

Because the 12V system voltage and the 5V standby voltage are respectively inputted to the gates of the first MOSFET and the second MOSFET, a voltage drop of the circuit is greatly reduced. So the supply voltage switching circuit of present invention can prevent the computer from being down when being waken up.

Other advantages and novel features will become more apparent from the following detailed description when taken in conjunction with the accompanying drawings, in which:

DETAILED DESCRIPTION OF THE EMBODIMENT

Figure 1:
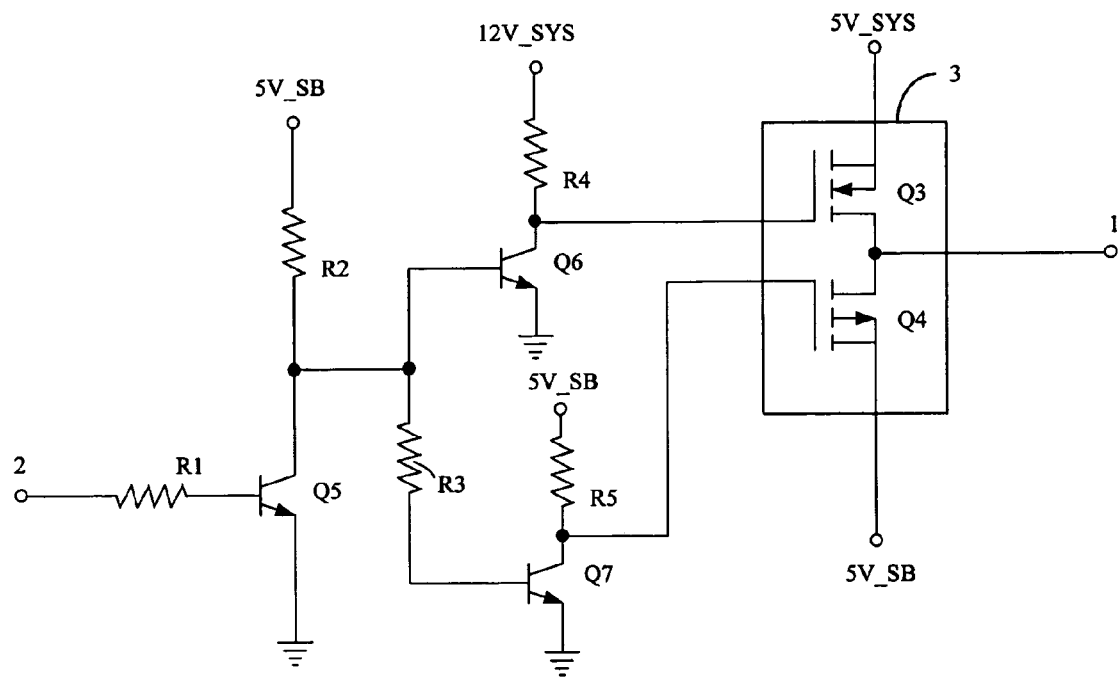
FIG. 1 is a circuit diagram of a supply voltage switching circuit for a computer, in accordance with a preferred embodiment of the present invention.

Referring to FIG. 1, a supply voltage switching circuit of a preferred embodiment of the present invention for an electronic device like a computer is shown. The supply voltage switching circuit comprises a chipset 3, a bipolar junction transistor (BJT) Q5, a BJT Q6, and a BJT Q7. The chipset 3 comprises a MOSFET Q3 and a MOSFET Q4. The MOSFET Q3 is an N-channel-strengthen MOSFET and the MOSFET Q4 is a P-channel-strengthen MOSFET. A base of the BJT Q5 is coupled to a terminal 2 via a resistor R1 for receiving a control signal form a computer. An emitter of the BJT Q5 is grounded. A collector of the BJT Q5 is coupled to a 5V_SB via a resistor R2. A base of the BJT Q6 is connected to the collector of the BJT Q5. An emitter of the BJT Q6 is grounded. A 12V_SYS used as one of control powers is inputted to a collector of the BJT Q6 via a resistor R4. A base of the BJT Q7 is coupled to the base of the BJT Q6 via a resistor R3. An emitter of the BJT Q7 is grounded. A 5V_SB used as another of the control powers is inputted to a collector of the BJT Q7 via a resistor R5. A gate of the MOSFET Q3 is connected to the collector of the BJT Q6. A 5V_SYS provided as one power source for a working mode of the computer is inputted to a source of the MOSFET Q3. A gate of the MOSFET Q4 is connected to the collector of the BJT Q7. A 5V_SB provided as another power source for a sleep mode of the computer is inputted to the source of the MOSFET Q4. A node between a drain of the MOSFET Q3 and a drain of the MOSFET Q4 is connected to a terminal 1.

A working process of the supply voltage switching circuit includes two stages. At the first stage, the computer is at a sleep mode, and a low level voltage from the computer is inputted to the base of the BJT Q5 via the terminal 2. So the BJT Q5 is turned off and the 5V_SB is inputted to bases of the BJT Q6 and the BJT Q7. The BJT Q6 and the BJT Q7 are turned on. Output voltages of the collector of the BJT 6 and the collector of the BJT Q7 are at low levels. Because the MOSFET Q3 is an N-channel-strengthen MOSFET and the MOSFET Q4 is a P-channel-strengthen MOSFET, the MOSFET Q3 is turned off and the MOSFET Q4 is turned on. So the terminal 1 outputs the 5V_SB at the first stage. At the second stage, the computer is at a work mode, and a PWR-OK signal from the computer is inputted to the base of the BJT Q5 via the terminal 2. So the BJT Q5 is turned on, and a low level voltage is inputted to bases of the BJT Q6 and the BJT Q7. The BJT Q6 and the BJT Q7 are turned off. Thus, the 12V_SYS is inputted to the gate of the MOSFET Q3 and the 5V_SB is inputted to the gate of the MOSFET Q4, so the MOSFET Q3 is turned on and the MOSFET Q4 is turned off. So the terminal 1 outputs the 5V_SYS at the second stage. That is, when the PWR-OK signal is inputted to the supply voltage switching circuit, the terminal 1 outputs the 5V_SYS.

Because the 12V_SYS and the 5V_SB are separately inputted to the gate of the MOSFET Q3 and the gate of the MOSFET Q4, a voltage drop of the output voltage of the terminal 1 is greatly reduced.

Figure 2:
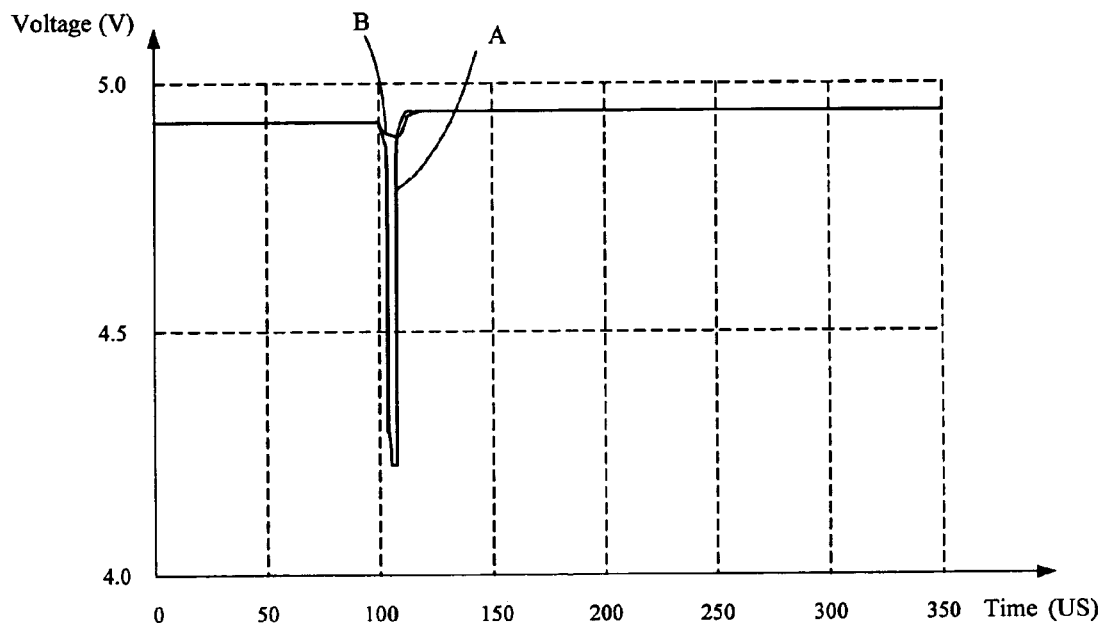
FIG. 2 is a diagram of output waveforms from the supply voltage switching circuit of FIG. 1 in comparison with that of a typical supply voltage switching circuit.
Figure 3:
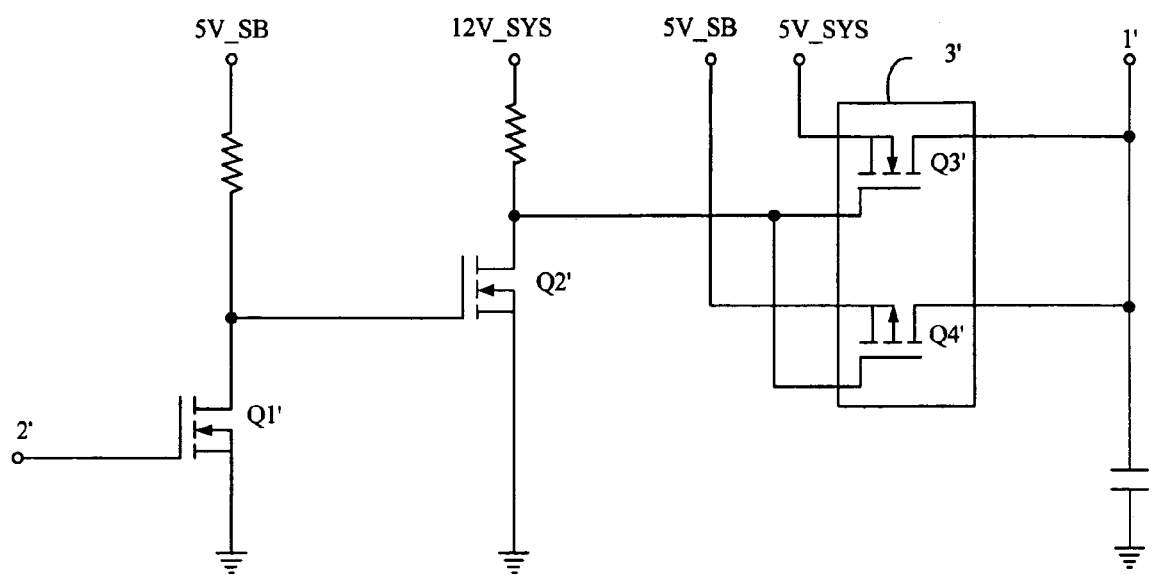
FIG. 3 is a circuit diagram of the typical supply voltage switching circuit for a computer.

Referring FIG. 2, it is a diagram of an output waveform from the supply voltage switching circuit of FIG. 1 in comparison with that of a typical supply voltage switching circuit. A waveform B is a waveform of the supply voltage switching circuit in accordance with the embodiment of the present invention. A waveform A is a waveform of the typical supply voltage switching circuit. Evidently, the waveform B has a more voltage drop than the waveform A. So the supply voltage switching circuit of the present invention can prevent the computer from being down when being waken up.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment.

What is claimed is:

1. A supply voltage switching circuit for a computer, the supply voltage switching circuit comprising:
   a chipset outputting a voltage for the computer, the chipset comprising:
   a first metal-oxide-semiconductor field-effect transistor (MOSFET), a gate of the first MOSFET receiving a first system voltage, a source of the first MOSFET receiving a second system voltage; and
   a second MOSFET, a gate and a source of the second MOSFET separately receiving a standby voltage, a drain of the second MOSFET connected to a drain of the first MOSFET;
   a first transistor having a first end and a second end, the first end receiving a control signal from the computer;
   a second transistor having a first end and a second end, the first end connected to the second end of the first transistor, the second end receiving the first system voltage and connected to the gate of the first MOSFET; and
   a third transistor having a first end and a second end, the first end connected to the second end of the first transistor, the second end receiving the standby voltage and connected to the gate of the second MOSFET.

2. The supply voltage switching circuit as claimed in claim 1, wherein the first system voltage is 12V.

3. The supply voltage switching circuit as claimed in claim 1, wherein the second system voltage is 5V.

4. The supply voltage switching circuit as claimed in claim 1, wherein the standby voltage is 5V.

5. The supply voltage switching circuit as claimed in claim 1, wherein the first MOSFET is an N-channel MOSFET.

6. The supply voltage switching circuit as claimed in claim 1, wherein the second MOSFET is a P-channel MOSFET.

7. The supply voltage switching circuit as claimed in claim 1, wherein the first transistor, the second transistor, and the third transistor are Bipolar Junction Transistors (BJTs).

8. A supply voltage switching circuit for a computer, the supply voltage switching circuit comprising:
   an N-channel metal-oxide-semiconductor field-effect transistor (MOSFET), a gate of the N-channel MOSFET receiving a first system voltage, a source of the N-channel MOSFET receiving a second system voltage;
   a P-channel MOSFET, a gate and a source of the P-channel MOSFET respectively receiving a standby voltage, a drain of the P-channel MOSFET connected to a drain of the P-channel MOSFET;
   a first transistor having a first end and a second end, the first end receiving a control signal from the computer;
   a second transistor having a first end and a second end, the first end connected to the second end of the first transistor, the second end receiving the first system voltage and connected to the gate of the N-channel MOSFET; and
   a third transistor having a first end and a second end, the first end connected to the second end of the first transistor, the second end receiving the standby voltage and connected to the gate of the P-channel MOSFET.

9. The supply voltage switching circuit as claimed in claim 8, wherein the first system voltage is 12V.

10. The supply voltage switching circuit as claimed in claim 8, wherein the second system voltage is 5V.

11. The supply voltage switching circuit as claimed in claim 8, wherein the standby voltage is 5V.

12. The supply voltage switching circuit as claimed in claim 8, wherein the first transistor, the second transistor, and the third transistor are Bipolar Junction Transistors (BJTs).

13. A switching circuit, comprising:

a chipset electrically connectable to a first power source and a second power source different from said first power source, and capable of switching to electrically connect a selective one of said first and second power sources so as to supply said selective one of said first and second power sources to an electronic device electrically connectable with said chipset;

a first switch having an end electrically connectable to a node between said chipset and a first control power, and a second switch having an end electrically connectable to another node between said chipset and a second control power different from said first control power, said first and second switches capable of accepting a control signal from said electronic device indicating a current mode of said electronic device and controllably providing said first control power and said second control power to said chipset respectively based on said control signal so as to control said chipset about provision of said selective one of said first and second power sources to said electronic device.

14. The switching circuit as claimed in claim 13, wherein said chipset comprises an N-channel metal-oxide-semiconductor field-effect transistor (MOSFET) electrically connectable between said first control power and said first power source, and a P-channel MOSFET electrically connectable between said second control power and said second power source.

15. The switching circuit as claimed in claim 13, wherein said first and second switches respectively comprise another end to electrically connect to ground.

* * * * *